US010163719B2

United States Patent
Liu et al.

(10) Patent No.: US 10,163,719 B2
(45) Date of Patent: Dec. 25, 2018

(54) METHOD OF FORMING SELF-ALIGNMENT CONTACT

(71) Applicant: Taiwan Semiconductor Manufacturing Company, Ltd., Hsin-Chu (TW)

(72) Inventors: Hsiao-Ping Liu, Hsin-Chu (TW);
Hung-Chang Hsu, Kaohsiung (TW);
Hung-Wen Su, Hsinchu County (TW);
Ming-Hsing Tsai, Chu-Pei (TW);
Rueijer Lin, Hsinchu (TW);
Sheng-Hsuan Lin, Hsinchu County (TW); Syun-Ming Jang, Hsin-Chu (TW); Ya-Lien Lee, Hsinchu County (TW); Yen-Shou Kao, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/969,213

(22) Filed: Dec. 15, 2015

(65) Prior Publication Data
US 2017/0170292 A1 Jun. 15, 2017

(51) Int. Cl.
| H01L 29/66 | (2006.01) |
| H01L 29/78 | (2006.01) |
| H01L 21/308 | (2006.01) |
| H01L 29/417 | (2006.01) |
| H01L 21/8234 | (2006.01) |

(52) U.S. Cl.
CPC .. *H01L 21/823475* (2013.01); *H01L 21/3083* (2013.01); *H01L 29/41783* (2013.01); *H01L 29/6653* (2013.01); *H01L 29/66515* (2013.01); *H01L 29/66553* (2013.01); *H01L 29/78* (2013.01); *H01L 21/823425* (2013.01)

(58) Field of Classification Search
CPC ......... H01L 29/41783; H01L 21/76897; H01L 21/823475; H01L 21/76811
See application file for complete search history.

(56) References Cited

U.S. PATENT DOCUMENTS

| 6,262,445 | B1 * | 7/2001 | Swanson | H01L 21/3065 |
| | | | | 257/288 |
| 6,291,355 | B1 * | 9/2001 | Liu | H01L 21/76897 |
| | | | | 257/E21.507 |
| 6,329,255 | B1 * | 12/2001 | Gau | H01L 21/76885 |
| | | | | 257/E21.507 |
| 6,407,420 | B1 * | 6/2002 | Yamanaka | H01L 27/10808 |
| | | | | 257/296 |

(Continued)

*Primary Examiner* — Joshua King
(74) *Attorney, Agent, or Firm* — Haynes and Boone, LLP

(57) ABSTRACT

A method of fabricating a semiconductor device is disclosed. The method includes forming a first gate stack over a substrate. The first gate stack includes a gate electrode, a first hard mask (HM) disposed over the gate electrode, and sidewall spacers along sidewalls of the first gate stack. The method also includes forming a first dielectric layer over the first gate stack, forming a second HM over the first HM and top surfaces of sidewall spacers, forming a second dielectric layer over the second HM and the first dielectric layer and removing the second and first dielectric layers to form a trench to expose a portion of the substrate while the second HM is disposed over the first gate stack.

20 Claims, 8 Drawing Sheets

(56) References Cited

U.S. PATENT DOCUMENTS

| | | | |
|---|---|---|---|
| 6,448,140 B1* | 9/2002 | Liaw | H01L 21/28114 257/E21.2 |
| 6,451,653 B2* | 9/2002 | Maurelli | H01L 27/105 257/326 |
| 7,253,123 B2* | 8/2007 | Arghavani | H01L 21/02126 257/E21.17 |
| 7,667,271 B2 | 2/2010 | Yu et al. | |
| 7,910,453 B2 | 3/2011 | Xu et al. | |
| 8,372,755 B2* | 2/2013 | Wang | H01L 21/823807 257/287 |
| 8,377,779 B1 | 2/2013 | Wang | |
| 8,399,931 B2 | 3/2013 | Liaw et al. | |
| 8,652,894 B2 | 2/2014 | Lin et al. | |
| 8,686,516 B2 | 4/2014 | Chen et al. | |
| 8,716,765 B2 | 5/2014 | Wu et al. | |
| 8,723,272 B2 | 5/2014 | Liu et al. | |
| 8,729,627 B2 | 5/2014 | Cheng et al. | |
| 8,735,993 B2 | 5/2014 | Lo et al. | |
| 8,736,056 B2 | 5/2014 | Lee et al. | |
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 2002/0001963 A1* | 1/2002 | Tadokoro | H01L 21/31116 438/710 |
| 2002/0039843 A1* | 4/2002 | Ikeda | H01L 21/31116 438/738 |
| 2002/0076918 A1* | 6/2002 | Han | H01L 21/76807 438/634 |
| 2003/0170954 A1* | 9/2003 | Rudeck | H01L 21/76816 438/266 |
| 2004/0076068 A1* | 4/2004 | Yamada | H01L 21/7684 365/232 |
| 2004/0166667 A1* | 8/2004 | Lee | H01L 21/76837 438/637 |
| 2008/0099840 A1* | 5/2008 | Enicks | H01L 21/30608 257/347 |
| 2008/0305627 A1* | 12/2008 | Maekawa | H01L 21/76831 438/637 |
| 2011/0135557 A1* | 6/2011 | Rangarajan | C23C 16/30 423/345 |
| 2013/0248950 A1* | 9/2013 | Kang | H01L 29/78 257/288 |
| 2013/0313647 A1* | 11/2013 | Aquilino | H01L 21/823807 257/368 |
| 2014/0001574 A1 | 1/2014 | Chen et al. | |
| 2014/0110755 A1 | 4/2014 | Colinge | |
| 2014/0151812 A1 | 6/2014 | Liaw | |
| 2015/0243747 A1* | 8/2015 | Kittl | H01L 27/1211 257/401 |
| 2016/0172456 A1* | 6/2016 | Li | H01L 29/41775 257/288 |

\* cited by examiner

METHOD OF FORMING SELF-ALIGNMENT CONTACT

BACKGROUND

The semiconductor integrated circuit (IC) industry has experienced rapid growth. Technological advances in IC design and material have produced generations of ICs where each generation has smaller and more complex circuits than previous generations. In the course of IC evolution, functional density (i.e., the number of interconnected devices per chip area) has generally increased while geometry size (i.e., the smallest component (or line) that can be created using a fabrication process) has decreased.

This scaling down process generally provides benefits by increasing production efficiency and lowering associated costs. Such scaling down has also increased the complexity of IC processing and manufacturing. For these advances to be realized, similar developments in IC processing and manufacturing are needed. One area is the wiring, or interconnects, between the transistors and other devices. Although existing methods of fabricating IC devices have been generally adequate for their intended purposes, they have not been entirely satisfactory in all respects. For example, challenges rise in forming contacts.

BRIEF DESCRIPTION OF THE DRAWINGS

Aspects of the present disclosure are best understood from the following detailed description when read in association with the accompanying figures. It is noted that, in accordance with the standard practice in the industry, various features in drawings are not drawn to scale. In fact, the dimensions of illustrated features may be arbitrarily increased or decreased for clarity of discussion.

DETAILED DESCRIPTION

Figure 1:
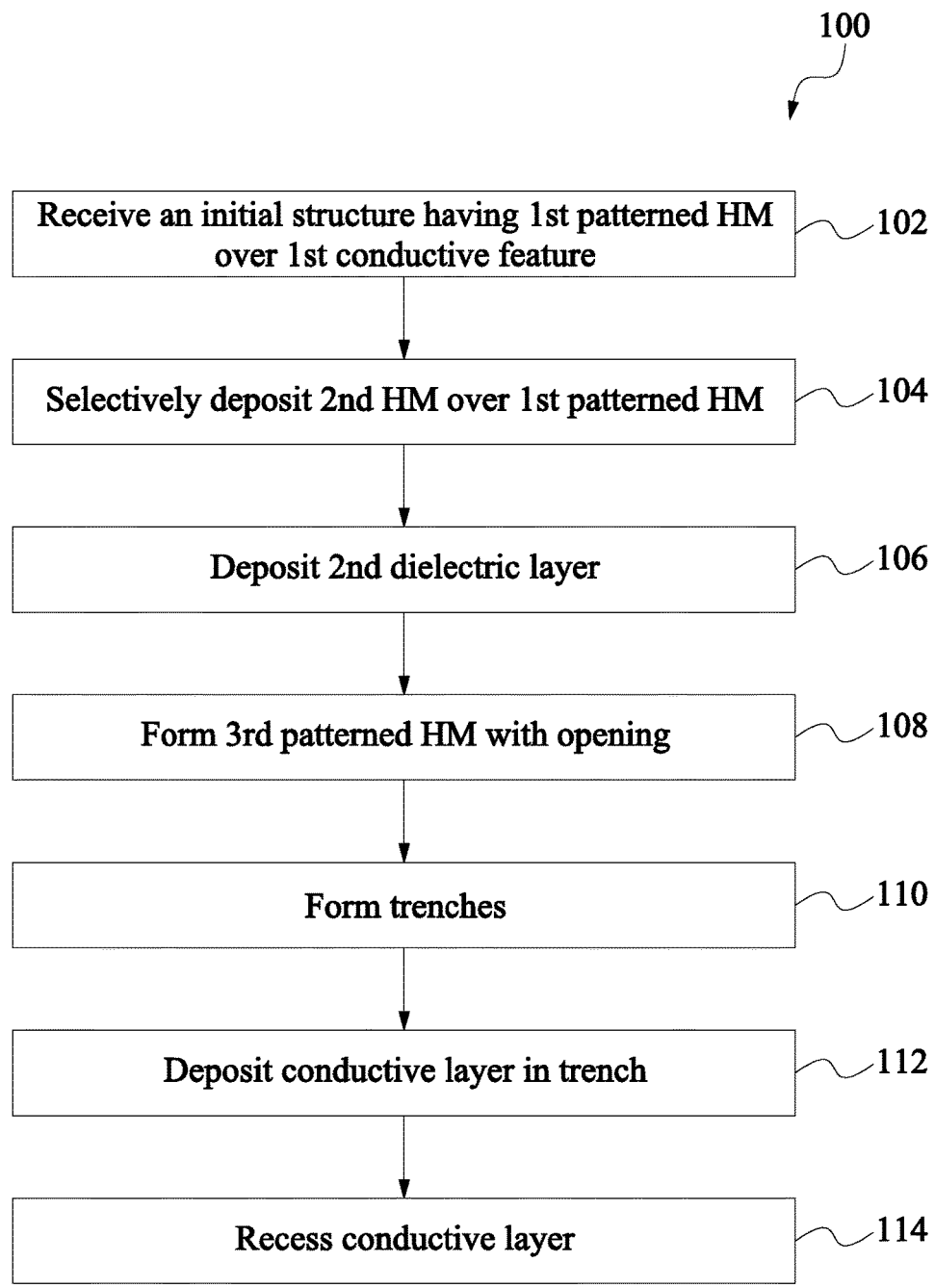
FIG. 1 is a flowchart of an example method for fabricating a semiconductor device constructed in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flowchart of a method 100 of fabricating one or more semiconductor devices in accordance with some embodiments. The method 100 is discussed in detail below, with reference to a semiconductor device 200, shown in FIGS. 2-8.

Figure 2:
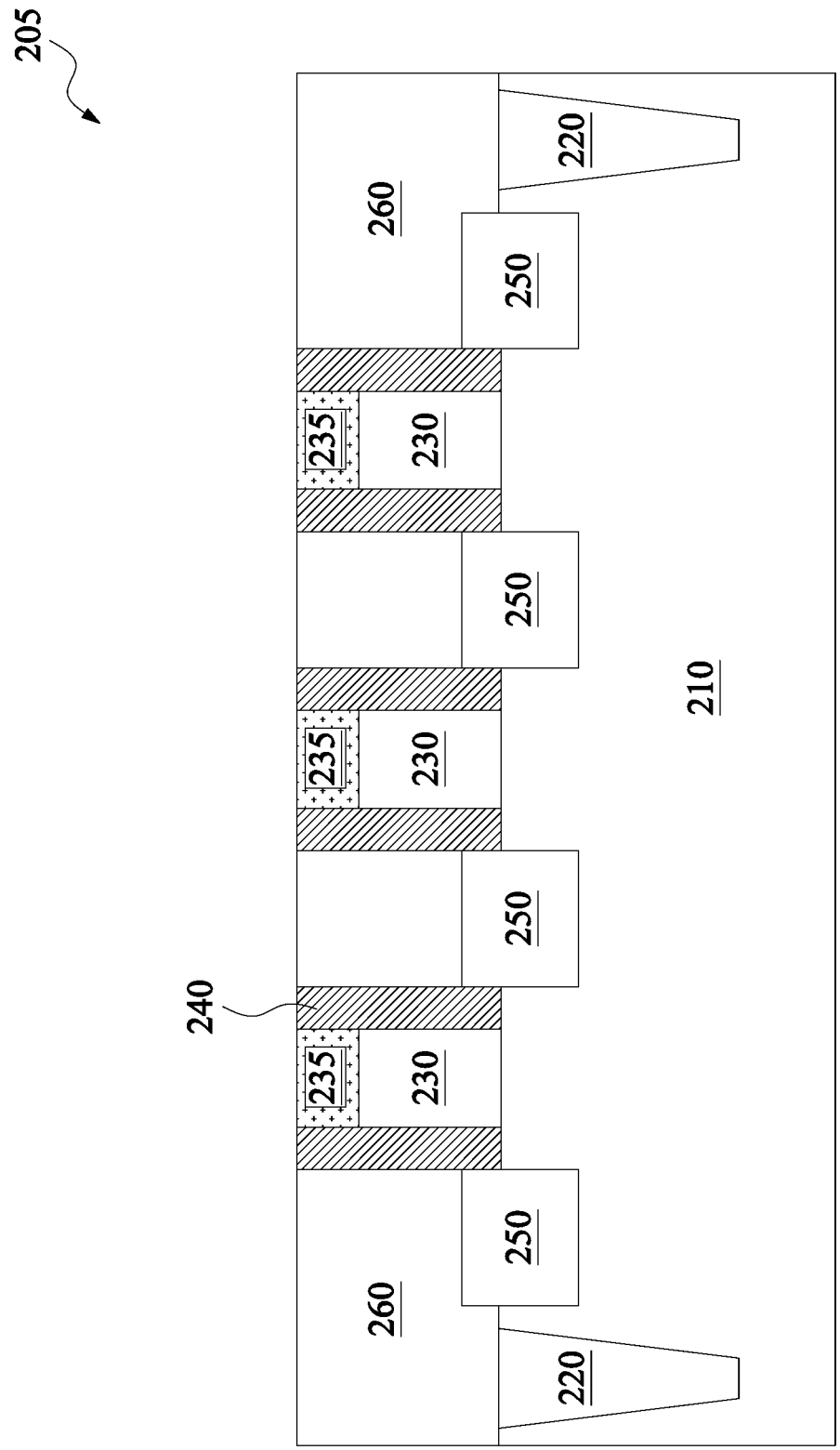
FIGS. 2 to 8 are cross-sectional views of an example semiconductor device in accordance with some embodiments.

Referring to FIGS. 1 and 2, the method 100 starts at step 102 by receiving an initial structure 205 of the semiconductor device 200. The initial structure 205 includes a substrate 210. The substrate 210 may be a bulk silicon substrate. Alternatively, the substrate 210 may comprise an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. Possible substrates 210 also include a silicon-on-insulator (SOI) substrate. SOI substrates are fabricated using separation by implantation of oxygen (SIMOX), wafer bonding, and/or other suitable methods.

Some exemplary substrates 210 also include an insulator layer. The insulator layer comprises any suitable material, including silicon oxide, sapphire, and/or combinations thereof. An exemplary insulator layer may be a buried oxide layer (BOX). The insulator is formed by any suitable process, such as implantation (e.g., SIMOX), oxidation, deposition, and/or other suitable process. In some exemplary semiconductor device 200, the insulator layer is a component (e.g., layer) of a silicon-on-insulator substrate.

The substrate 210 may also include various doped regions. The doped regions may be doped with p-type dopants, such as boron or BF2; n-type dopants, such as phosphorus or arsenic; or combinations thereof. The doped regions may be formed directly on the substrate 210, in a P-well structure, in an N-well structure, in a dual-well structure, or using a raised structure. The substrate 210 may further include various active regions, such as regions configured for an N-type metal-oxide-semiconductor transistor device and regions configured for a P-type metal-oxide-semiconductor transistor device.

The substrate 210 may also include various isolation features 220. The isolation features 220 separate various device regions in the substrate 210. The isolation features 220 include different structures formed by using different processing technologies. For example, the isolation features 220 may include shallow trench isolation (STI) features. The formation of a STI may include etching a trench in the substrate 210 and filling in the trench with insulator materials such as silicon oxide, silicon nitride, or silicon oxynitride. The filled trench may have a multi-layer structure such as a thermal oxide liner layer with silicon nitride filling the trench. A chemical mechanical polishing (CMP) may be performed to polish back excessive insulator materials and planarize the top surface of the isolation features 220.

The initial structure 205 also includes a plurality of first conductive features 230 over the substrate 210. In some embodiments, the first conductive features 230 may be gate stack including high-k/metal gates (HK/MGs). The HK/MGs 230 may include a gate dielectric layer and a metal gate (MG). The gate dielectric layer may include LaO, AlO, ZrO, TiO, Ta2O5, Y2O3, SrTiO3 (STO), BaTiO3 (BTO), BaZrO, HfZrO, HfLaO, HfSiO, LaSiO, AlSiO, HfTaO, HfTiO, (Ba,Sr)TiO3 (BST), Al2O3, Si3N4, oxynitrides (SiON), or other suitable materials. The MG may include a single layer or multi layers, such as a metal layer, a liner layer, a wetting layer, and an adhesion layer. The MG may include Ti, Ag, Al, TiAlN, TaC, TaCN, TaSiN, Mn, Zr, TiN, TaN, Ru, Mo, Al, WN, Cu, W, or any suitable materials. The gate dielectric layers may be deposited by a suitable method, such as chemical vapor deposition (CVD), atomic layer deposition (ALD), thermal oxidation or ozone oxidation, other suitable technique, or a combination thereof. The MG may be formed by ALD, physical vapor deposition (PVD), CVD, or other suitable process.

In some embodiment, dummy gate stacks are formed first and then are replaced later by HK/MGs 230 after high thermal temperature processes are performed, such as thermal processes during sources/drains formation. The dummy gate stack may include a dummy gate dielectric layer and a polysilicon layer and may be formed by deposition, patterning and etching processes.

In the present embodiment, a first hard mask (HM) 235 is formed on top of each of the HK/MGs 230. The first HM 235 may include titanium nitride, silicon nitride, silicon carbide, silicon carbide nitride, or other suitable material. The first HM 235 be formed by deposition, lithography patterning and etch processes.

In some embodiment, sidewall spacers 240 may be formed along the sidewalls of the HK/MGs 230. The sidewall spacers 240 may include a dielectric material such as silicon nitride. Alternatively, the sidewall spacers 240 may include silicon carbide, silicon oxynitride, or other suitable material. The sidewall spacers 240 may be formed by depositing a gate sidewall spacer layer and then anisotropic dry etching the gate sidewall spacer layer. For the purpose of simplicity and clarity, the first conductive feature 230 in the present embodiment is a HK/MG 230 having the first HM 235 and the sidewall spacer 240, hereinafter.

Alternatively, in some embodiments, the first conductive features 230 may also include a portion of the interconnect structure, such as a contact, metal via, and/or metal line. In one embodiment, the first conductive features 230 include electrodes, capacitors, resistors or a portion of a resistor. The first HM 235 is formed to cover a top surface of the first conductive features 230. The first HM 235 may include tantalum (Ta), titanium (Ti), manganese (Mn), cobalt (Co), ruthenium (Ru), TiN, TaN, WN, TiSiN, TaSiN, aluminum nitride, aluminum oxide, and/or other suitable materials. The first HM 235 and the first conductive feature 230 may be formed by processes such as deposition, photolithography and etch.

The initial structure 205 also may include second conductive features 250 over the substrate 210. A top surface of the second conductive feature 250 may not be at the same horizontal level as the first conductive feature 230. For example, the top surface of the second conductive feature 250 is below the top surface of the first conductive feature 230. That is, as shown, the top surface of the second conductive feature 250 is non-coplanar with respect to the top surface of the first conductive feature 230. The second conductive feature 250 may be formed by processes such as deposition, photolithography and etch.

In some embodiments, the second conductive features 250 are source/drain (S/D) features, beside and separated by the HK/MG 230. In one embodiment, a portion of the substrate 210, beside the HK/MG 230 is recessed to form S/D recesses and then the S/D features 250 are formed over the S/D recesses by epitaxial growing processes, such as CVD, VPE and/or UHV-CVD, molecular beam epitaxy, and/or other suitable processes.

The S/D features 250 may include germanium (Ge), silicon (Si), gallium arsenide (GaAs), aluminum gallium arsenide (AlGaAs), silicon germanium (SiGe), gallium arsenide phosphide (GaAsP), gallium antimony (GaSb), indium antimony (InSb), indium gallium arsenide (InGaAs), indium arsenide (InAs), and/or other suitable materials.

The S/D features 250 may be formed by epitaxial growing processes, such as CVD deposition techniques (e.g., vapor-phase epitaxy (VPE) and/or ultra-high vacuum CVD (UHV-CVD)), molecular beam epitaxy, and/or other suitable processes. After the S/D recesses are filled with the S/D feature 250, further epitaxial growth of a top layer of the S/D features 250 expands horizontally and facets may start to form, such as a diamond shape facets. The S/D features 250 may be in-situ doped during the epi processes. For example, in one embodiment, the S/D feature 250 includes an epitaxially grown SiGe layer that is doped with boron. In another embodiment, the S/D feature 250 includes an epitaxially grown Si epi layer that is doped with carbon. In yet another embodiment, the S/D feature 250 includes an epitaxially grown Si epi layer that is doped with phosphorous. In one embodiment, the S/D feature 250 is not in-situ doped, and as such an implantation process (i.e., a junction implant process) is performed to dope the S/D feature 250. One or more annealing processes may be performed to activate dopants. The one or more annealing processes comprise rapid thermal annealing (RTA) and/or laser annealing processes. For the purpose of simplicity and clarity, the second conductive feature 250 in the present embodiment is a S/D feature 250 and is referred to as such.

Alternatively, in some embodiment, the second conductive feature 250 may also include a portion of the interconnect structure, such as a contact, metal via, and/or metal line. In one embodiment, the first conductive features 250 include electrodes, capacitors, resistors or a portion of a resistor.

In the present embodiment, the initial structure 205 includes a first dielectric layer 260 deposited over the substrate 210, including between/over each of the HK/MGs 230 and over the S/D features 250. The S/D features 250 are embedded in the first dielectric layer 260. The first dielectric layer 260 may include silicon oxide, a dielectric material having a dielectric constant (k) lower than thermal silicon oxide (therefore referred to as low-k dielectric material layer), and/or other suitable dielectric material layer. The first dielectric layer 260 may include a single layer or multiple layers. The first dielectric layer 260 may be deposited by CVD, ALD or spin-on coating.

In the present embodiment, the first dielectric layer 260 is different from the first HM 235, as well as the sidewall spacer 240, to achieve selective deposition during a subsequent deposition process as described in more detail below. In one embodiment, the first dielectric layer 260 includes silicon oxide while both of the sidewall spacer 240 and the first HM 235 include silicon nitride. In another embodiment, the first dielectric layer 260 includes silicon oxide while the first HM 235 includes titanium nitride and the sidewall spacer 240 includes silicon nitride.

Figure 3:
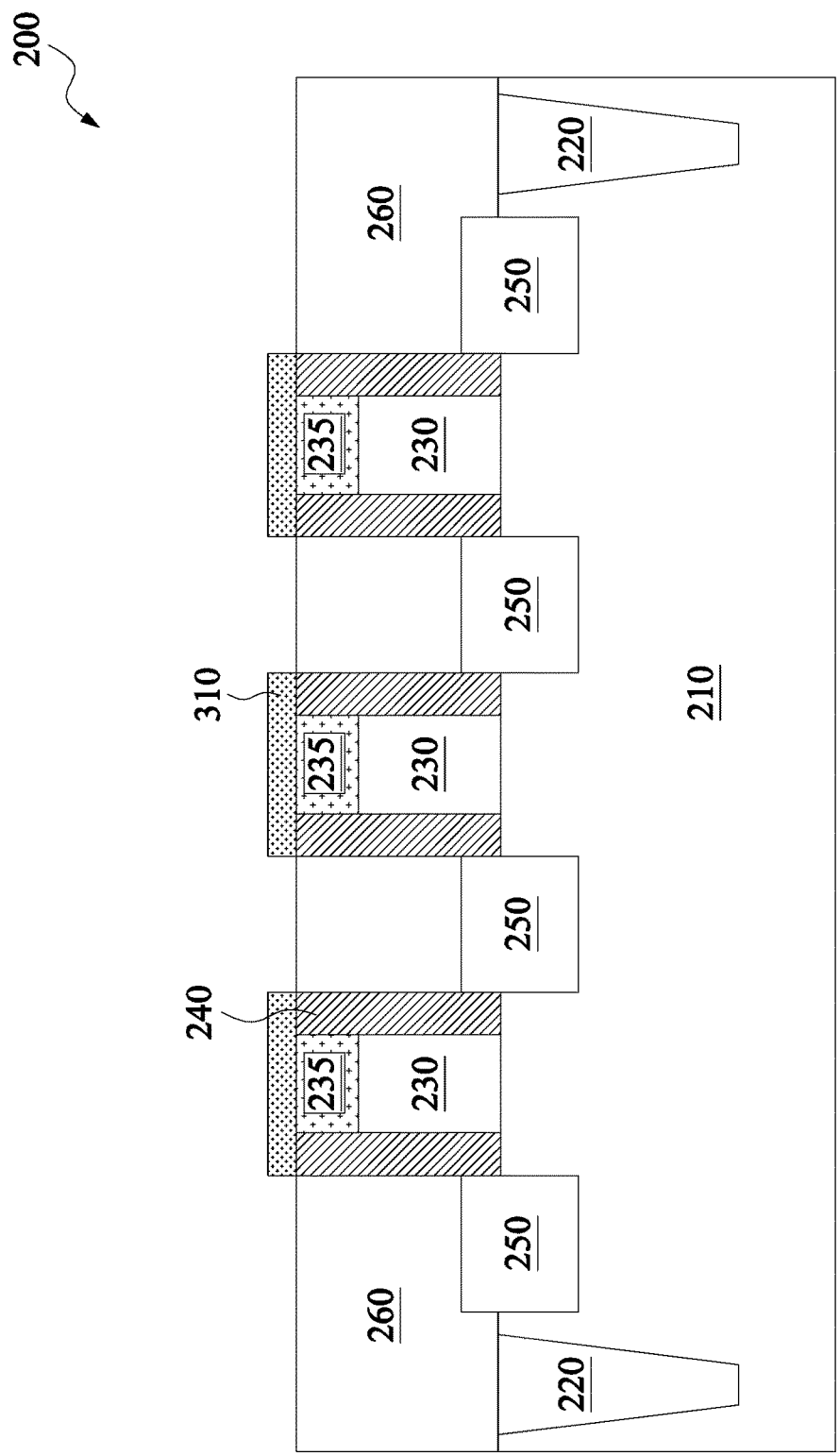

Referring to FIGS. 1 and 3, once the initial structure 205 is received, the method of 100 proceeds to step 104 by forming a second hard mask (HM) 310 (or insurance-HM) by a selective deposition over substrate 210. The material of second HM 310 is chosen to withstand a subsequent trench etching process, which etches the first dielectric layer 260. In the present embodiment, the deposition process is properly chosen to selectively deposit the second HM 310 over the first HM 235 and the sidewall spacer 240, while avoiding deposition over the first dielectric layer 260. By this selective deposition, second HM 310 is formed over the first HM 235 with a self-alignment nature.

In the present embodiment, a CVD boron deposition process is applied to selectively form a second HM 310 over the first HM 235 and the sidewall spacer 240. In one embodiment, in the CVD boron deposition process, the gas flow of B2H6 gas ranges between about 100 sccm and about 400 sccm; the gas flow of Ar ranges between about 100 and about 400 sccm; the gas flow of H2 ranges between about 100 sccm to about 400 sccm; the process pressure (chamber pressure) ranges between about 15 torr and about 50 torr and the process temperature (substrate temperature) ranges between about 300 C to about 400 C.

In one embodiment, the second HM 310 is selectively formed over and in physical contact with a silicon nitride first HM 235 and a silicon nitride sidewall spacer 240. In another embodiment, the second HM 310 is selectively formed over and in physical contact with a titanium nitride first HM 235 and a silicon nitride sidewall spacer 240.

Figure 4:
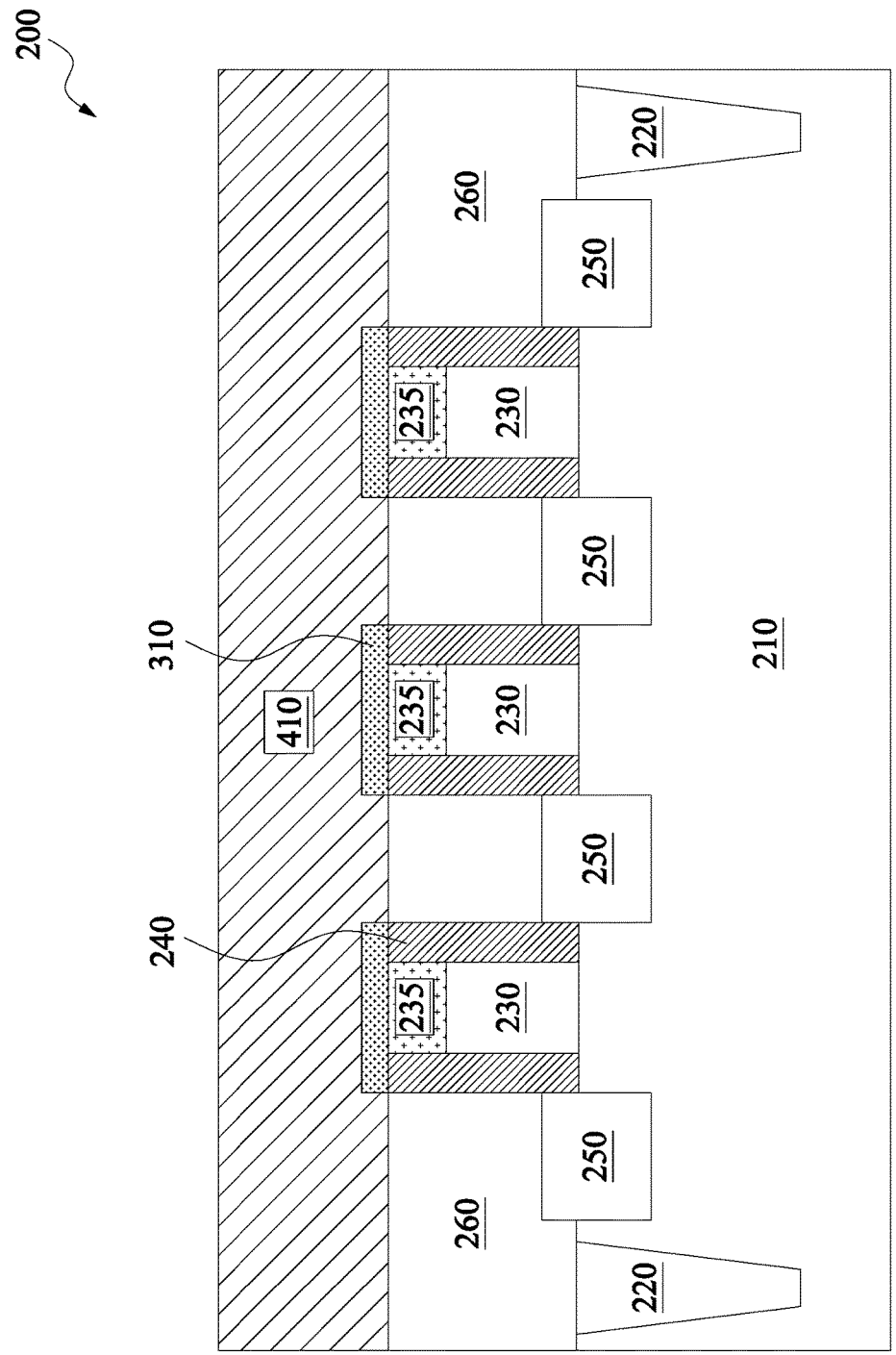

Referring to FIGS. 1 and 4, the method 100 proceeds to step 106 by depositing a second dielectric layer 410 over the first dielectric layer 260 and the second HM 310. The second dielectric layer 410 may include silicon oxide, a low-k dielectric material, and/or other suitable dielectric material layer. The second dielectric layer 410 may include a single layer or multiple layers. In the present embodiments, the second dielectric layer 410 is different from the second HM 310, the first HM layer 235, the sidewall spacer 240 to achieve etching selectivity during a subsequent trench etch as described below in more detail. The second dielectric layer 410 is formed similarly in many respects to the first dielectric layer 260 discussed above in association with FIG. 2.

Figure 5:
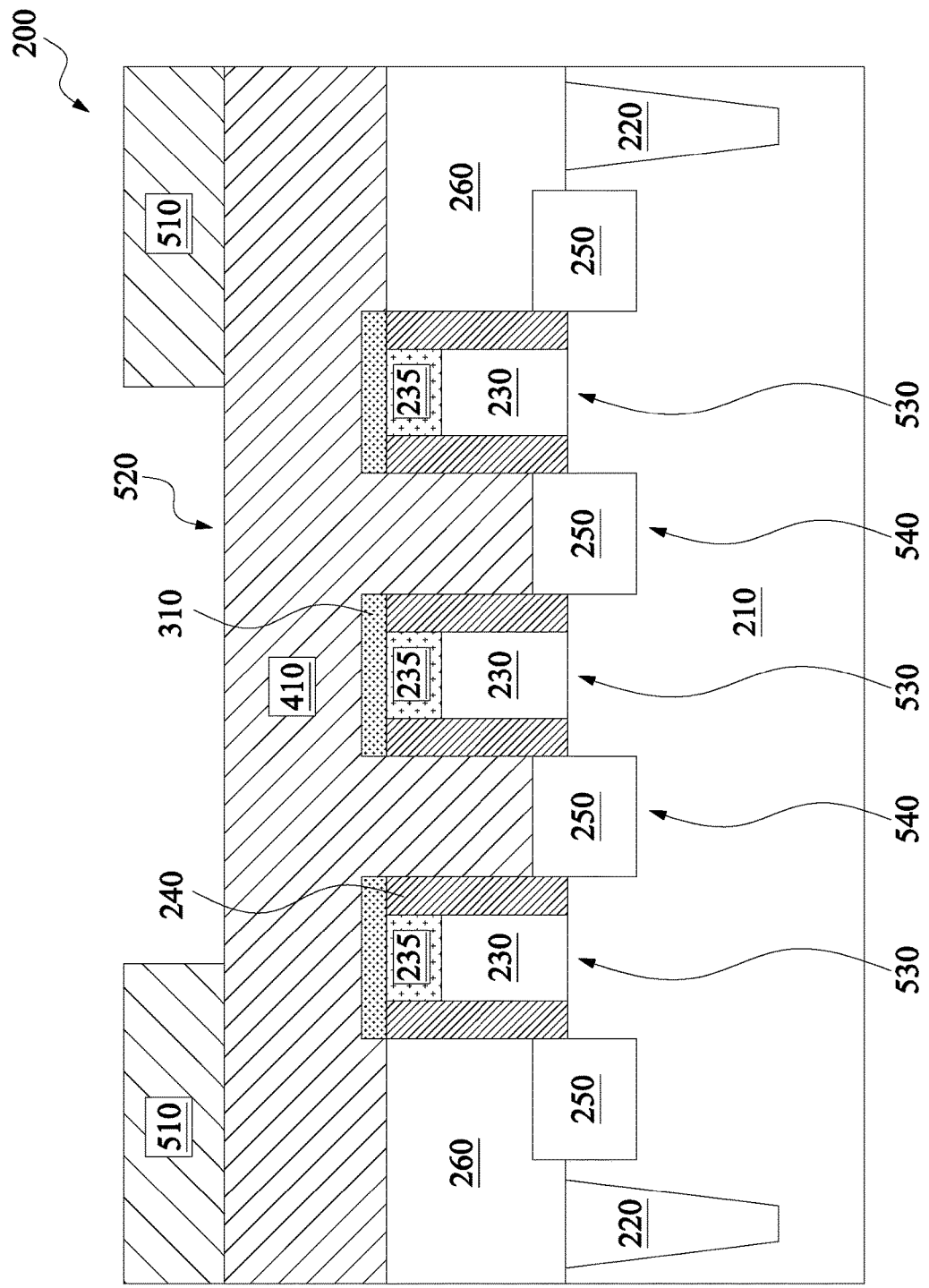

Referring to FIGS. 1 and 5, the method 100 proceeds to step 108 by forming a third HM 510 with an opening 520 over the second dielectric layer 410. In the present embodiment, a subset 530 of HK/MGs 230 and a subset 540 of the S/D features 250 are within the opening 520. In one embodiment, the third HM 510 is a patterned photoresist layer. In another embodiment, the third HM layer 510 is formed by depositing a sub-HM layer over the second dielectric layer 410, depositing photoresist layer over the sub-HM layer, patterning the photoresist layer, then etching the sub-HM layer through patterned photoresist layer to pattern the sub-HM layer and then etching the third HM 510 through the patterned sub-HM layer to form the opening 520 in the third HM 510.

Figure 6:
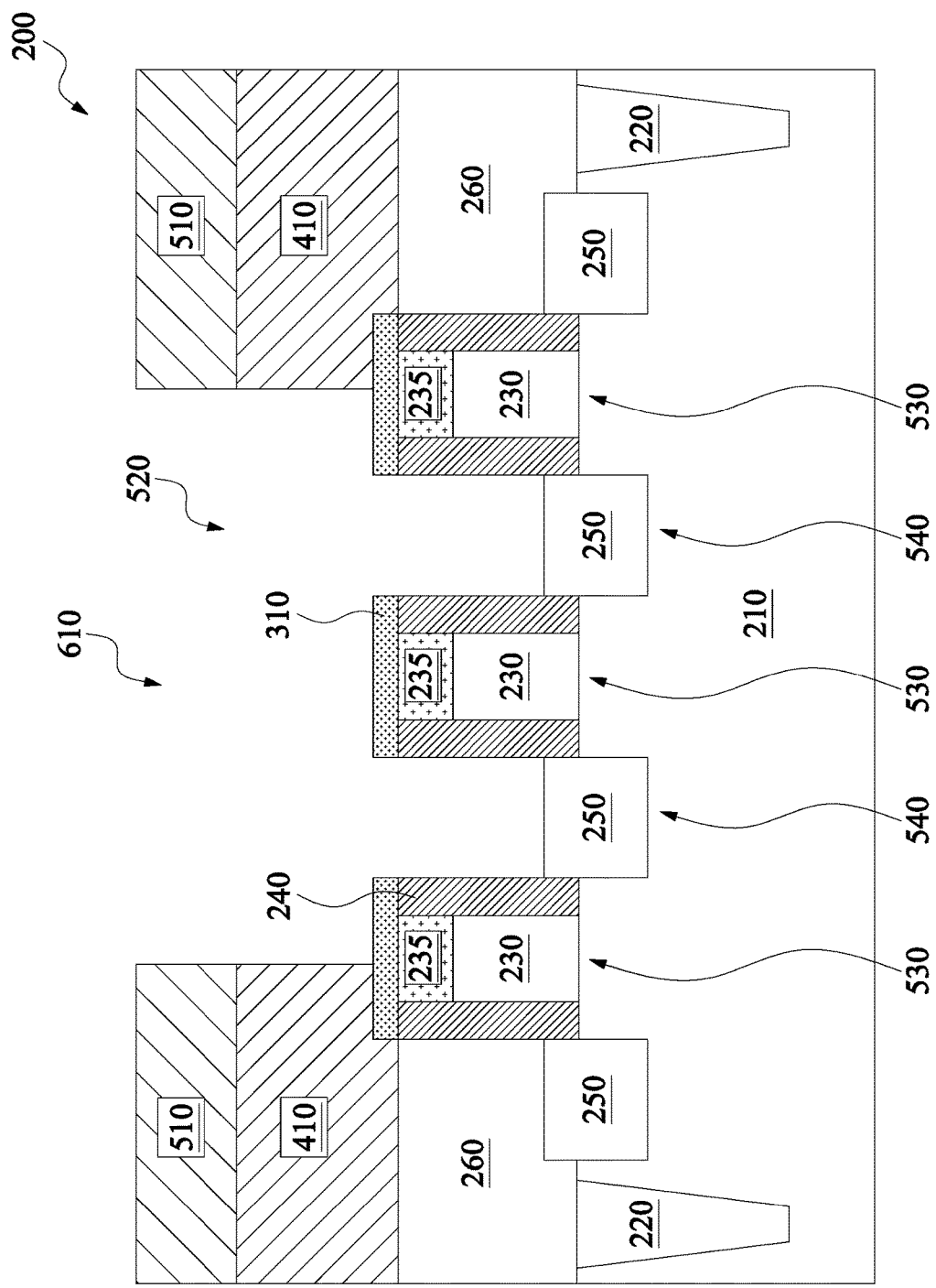

Referring to FIGS. 1 and 6 the method 100 proceeds to step 110 by etching the second and first dielectric layers, 410 and 260, through the opening 520 to form a trench 610. As shown, the second and first dielectric layers, 410 and 260, between some of the HK/MGs 230 (e.g. subset 530 of HK/MGs 230) are removed to expose some of the S/D features 250 (e.g. subset 540 of S/D features 250). Therefore, trench 610 is sometimes referred to as a S/D contact trench. As discussed above, the trench etch process is properly chosen to selectively remove the second and the first dielectric layers, 410 and 260, but substantially does not etch the second HM 310, as well as the first HM 235, and the sidewall spacer 240. With the adequate etch selectivity, the trench 610 is formed with a self-alignment nature, which relaxes process constrains, such as misalignment, and/or overlay issue in lithograph process, pattern loading effect, and etch process window.

The first HM 235, without the second HM 310, is typically used to protect the HK/MG (or first conductive feature) 230 during this self-alignment trench etch process. However, sometimes an etch rate of the first HM 235 is not low enough such that the first HM 235 is etched away during forming the trench 610 thereby exposing a portion of the HK/MG 230. This leads to shorting issues when forming a conductive feature over S/D features. In the present embodiment, during etching the second and first dielectric layers, 260 and 410, the second HM 310 is etched much slower than the first HM 235 and the sidewall spacer 240. Therefore, the second HM 310 enhances protection for the HK/MGs 230, thereby preventing exposure of the HK/MG 230 during etching process and subsequent shorting issues that follow therefrom.

The trench etch may include a selective wet etch, a selective dry etch, and/or a combination thereof. The respective etch process may be tuned with various etching parameters, such as etchant used, etching temperature, etching solution concentration, etching pressure, etchant flow rate, and/or other suitable parameters.

As an example, the second HM 310 includes boron and both of the first HM 234 and sidewall spacer 240 includes silicon nitride. The trench etch includes a plasma dry etching process using a fluorine-based chemistry, such as CF4, SF6, CH2F2, CHF3, and/or C2F6. An etch rate of the first and second dielectric layer, 260 and 410, is more than three times higher than an etch rate of the first HM 235 and more than 10 times higher than an etch rate of the second HM 310.

After forming the trench 610, the third HM 510 is removed by a proper etch process. In one example where the third HM 510 is a resist pattern, the third HM 510 is removed thereafter by wet stripping and/or plasma ashing.

Figure 7:
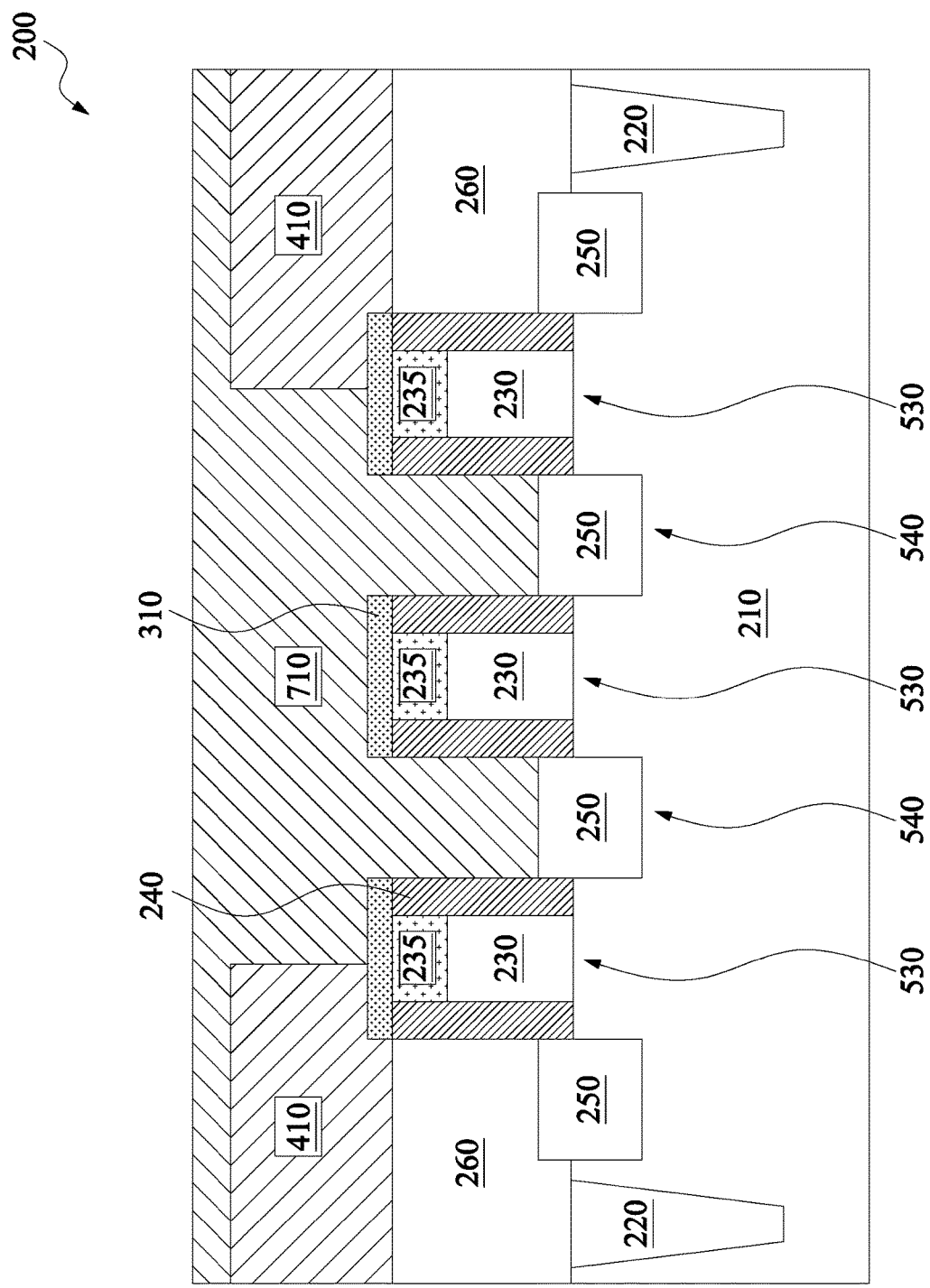

Referring to FIGS. 1 and 7, the method 100 proceeds to step 112 by depositing a conductive layer 710 in the trench 610 to extending down to and be physical contact with the subset 540 of the S/D features 250. The conductive layer 710 may include metal layer, such as copper (Cu), aluminum (Al), tungsten (W), copper, copper magnesium (CuMn), copper aluminum (CuAl) or copper silicon (CuSi), or other suitable conductive material. The conductive layer 710 may be deposited by PVD, CVD, metal-organic chemical vapor deposition (MOCVD), or plating.

Figure 8:
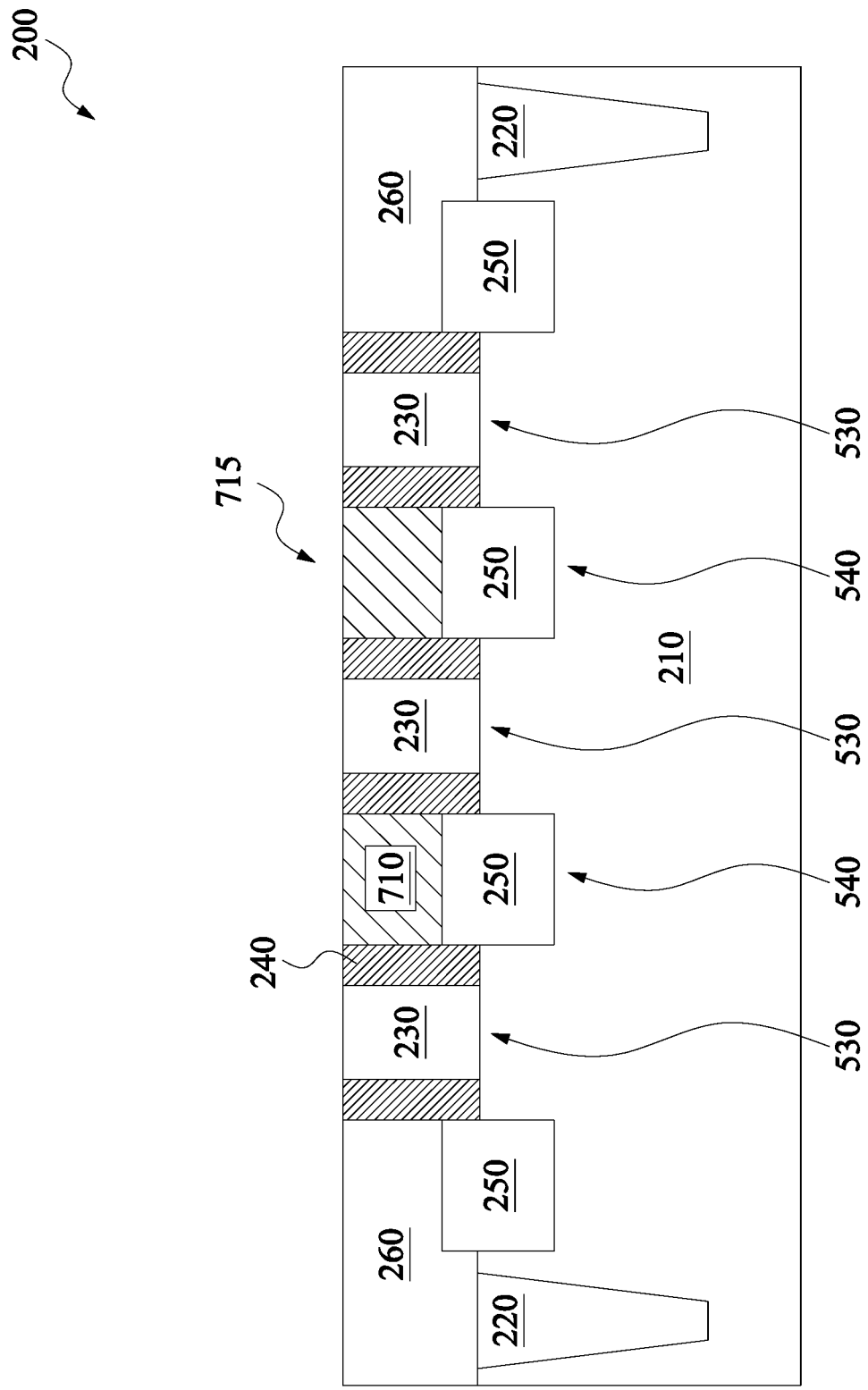

Referring to FIGS. 1 and 8, the method 100 proceeds to step 118 by recessing the conductive layer 710. In some embodiments, a CMP process is performed to remove excessive conductive layer 710, as well as the second HM 310 and the first HM 235. The remaining conductive layer 710 forms a conductive feature 715, which physically contacts the S/D feature 250 while the HK/MGs 230 is isolated from the conductive feature 715 by being surrounded by the sidewall spacer 240.

Additional steps can be provided before, during, and after the method 100, and some of the steps described can be replaced, eliminated, or moved around for additional embodiments of the method 100.

The semiconductor devices, 200, may include additional features, which may be formed by subsequent processing. For example, various vias/lines and multilayers interconnect features (e.g., metal layers and interlayer dielectrics) are formed over the substrate 210. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

Based on the above, it can be seen that the present disclosure provide methods of forming self-alignment contact trench. The method employs selective forming an insurance-HM to protect the HK/MG during contact trench formation, where the HK/MGs are exposed to the trench etching process. The method demonstrates preventing MG loss during S/D contact trench formation to prevent MG electric short. The method provides a robust self-aligned-contact formation process with relaxed process constrains.

The present disclosure provides many different embodiments of fabricating a semiconductor device that provide one or more improvements over existing approaches. In one embodiment, a method for fabricating a semiconductor device includes forming a first gate stack over a substrate. The first gate stack includes a gate electrode, a first hard mask (HM) disposed over the gate electrode, and sidewall spacers along sidewalls of the first gate stack. The method also includes forming a first dielectric layer over the first gate stack, forming a second HM over the first HM and top surfaces of sidewall spacers, forming a second dielectric layer over the second HM and the first dielectric layer and removing the second and first dielectric layers to form a trench to expose a portion of the substrate while the second HM is disposed over the first gate stack.

In yet another embodiment, a method includes providing an initial structure. The initial structure includes forming a gate structure over a substrate. The gate structure includes a first hard mask (HM) layer and sidewall spacers along sidewalls of the gate structure. The method also includes forming a source/drain (S/D) feature in the substrate adjacent the gate structure, forming a first dielectric layer over the gate structure, wherein the S/D feature embedded in the first dielectric layer, forming a second HM over the first HM and over a top surface of sidewall spacers, forming a second dielectric layer over the gate structure, removing the second and first dielectric layers to form a trench while the gate structure is protected by the second HM and forming a conductive feature in the trench.

In yet another embodiment, a semiconductor device includes forming a first gate structure and a second gate structure over a substrate. The first gate structure includes a first hard mask (HM) layer and sidewall spacers along sidewalls of the first gate structure and the second gate structure includes the first hard mask (HM) layer and sidewall spacers along sidewalls of the second gate structure. The method also includes forming a source/drain (S/D) feature in the substrate, forming a first dielectric layer over the first and second gate structures, forming a second HM directly on the first HM of the first and second gate structures, forming a second dielectric layer over the second HM, removing the second and first dielectric layers to form a trench while the gate structure is protected by the second HM and forming a conductive feature in the trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a gate stack over a substrate, wherein the gate stack includes a gate electrode and a first hard mask (HM) disposed over the gate electrode, and further wherein sidewall spacers are disposed along sidewalls of the gate stack;
   forming a first dielectric layer over the substrate;
   forming a second HM over the first HM and top surfaces of the sidewall spacers, the second HM being formed as a deposited boron based layer;
   forming a second dielectric layer over the second HM and the first dielectric layer;
   forming a trench in the second and the first dielectric layers to expose a portion of the substrate while the second HM is disposed over the gate stack;
   filling the trench in the second and the first dielectric layers with a conductive layer;
   planarizing the conductive layer; and
   removing the second dielectric layer, the second HM, and the first HM.

2. The method of claim 1, wherein the second HM is selectively formed over the first HM and top surface of the sidewall spacers but not over the first dielectric layer.

3. The method of claim 1, wherein the sidewall spacers include silicon carbide.

4. The method of claim 1, wherein the deposited boron based layer is formed by chemical vapor deposition technique.

5. The method of claim 1, wherein the forming of the trench in the second and the first dielectric layers to expose a portion of the substrate while the second HM is disposed over the gate stack includes:
   forming a third HM having an opening over the second dielectric layer, wherein a portion of the gate stack is within the opening; and
   selectively etching the second and the first dielectric layers through the opening.

6. The method of claim 5, wherein the selectively etching the second and the first dielectric layers has a substantial higher etch selectivity of the first and the second dielectric layer to the second HM than to the first HM.

7. The method of claim 1, wherein the planarizing of the conductive layer removes the second dielectric layer, the second HM, and the first HM.

8. The method of claim 1, wherein the first dielectric layer and the second dielectric layer include substantially the same materials.

9. A method comprising:
   forming a gate structure over a substrate, wherein the gate structure includes a metal gate, a first hard mask (HM) layer over the metal gate, and sidewall spacers along sidewalls of the metal gate and the first HM layer;
   forming a source/drain (S/D) feature in the substrate adjacent the gate structure;
   forming a first dielectric layer over the gate structure;
   selectively depositing a second HM layer over the first HM layer and over a top surface of the sidewall spacers, the second HM layer being a boron based layer;
   forming a second dielectric layer over the gate structure;
   removing portions of the second and the first dielectric layers to form a trench while the gate structure is protected by the second HM layer;
   depositing a conductive material in the trench formed in the second and the first dielectric layers; and removing the second dielectric layer, the second HM layer, the first HM layer, and portions of the conductive material to form a conductive feature, such that the metal gate is exposed.

10. The method of claim 9, wherein the second HM is selectively deposited over the first HM and the top surface of the sidewall spacers but not over the first dielectric layer.

11. The method of claim 9, wherein the second HM is deposited by a chemical vapor deposition technique at a processing temperature of between 300 C. and 400 C.

12. The method of claim 9, wherein the trench is formed to extend vertically through the first and the second dielectric layers to expose the S/D feature.

13. The method of claim 9, wherein the removing of the portions of the second and the first dielectric layers to form a trench while the gate structure is protected by the second HM includes:
   forming a third HM having an opening over the second dielectric layer, wherein the gate structure is within the opening; and
   selectively etching the second and the first dielectric layers through the opening.

14. The method of claim 13, wherein the selectively etching the second and the first dielectric layers has a substantially higher etch selectivity of the first and the second dielectric layer to the second HM than to the first HM.

15. The method of claim 9, wherein the first dielectric layer includes silicon oxide, and wherein the selectively depositing the second HM layer is not performed on the first dielectric layer.

16. A method comprising:
   forming a first gate structure and a second gate structure over a substrate, wherein the first gate structure and the second gate structure each include a gate stack that includes a silicon nitride hard mask (HM) layer disposed over a gate electrode and silicon nitride sidewall spacers along sidewalls of the gate stack;
   forming a source/drain (S/D) feature in the substrate, such that the S/D feature is disposed between the first gate structure and the second gate structure;
   forming a first silicon oxide layer over the first and the second gate structures and the S/D feature;
   selectively depositing a boron based layer over and in physical contact with the silicon nitride HM layer of the first and the second gate structures but not over the first silicon oxide layer;
   forming a second silicon oxide layer over the boron based layer and the first silicon oxide layer;
   forming a trench in the second and the first silicon oxide layers to expose the S/D feature while the first and the second gate structures are protected by the boron based layer;
   forming at least one conductive feature in the trench; and
   removing the second silicon oxide layer, the boron based layer, and the silicon nitride HM layer.

17. The method of claim 16, wherein the boron based layer is also over and in physical contact with the silicon nitride sidewall spacers.

18. The method of claim 16, wherein the forming of the trench in the second and the first silicon oxide layers while the first and the second gate structures are protected by the boron based layer includes selectively etching the second and the first silicon oxide layers, wherein the first and the second silicon oxide layers have a substantially higher etch selectivity to the boron based layer than to the silicon nitride HM.

19. The method of claim 16, wherein the forming of the trench in the second and the first silicon oxide layers to expose a portion of the substrate while the boron based layer is disposed over the first gate structure includes:
   forming a HM layer having an opening over the second silicon oxide layer, wherein portions of the first and the second gate structures are within the opening; and
   selectively etching the second and the first silicon oxide layers through the opening.

20. The method of claim 16, wherein the forming of the at least one conductive feature includes:
   filling the trench with a conductive layer, wherein the conductive layer contacts the second silicon oxide layer; and
   planarizing the conductive layer.

* * * * *